United States Patent
Foote et al.

(10) Patent No.: US 6,242,305 B1
(45) Date of Patent: Jun. 5, 2001

(54) PROCESS FOR FABRICATING A BIT-LINE USING BURIED DIFFUSION ISOLATION

(75) Inventors: David K. Foote, San Jose; Hideki Komori; Bharath Rangarajan, both of Santa Clara; Fei Wang, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/427,404

(22) Filed: Oct. 25, 1999

(51) Int. Cl.⁷ .............................................. H01L 21/8247
(52) U.S. Cl. ........................................... 438/262; 438/261
(58) Field of Search ..................................... 438/257–267

(56) References Cited

U.S. PATENT DOCUMENTS

| | | |
|---|---|---|
| 4,713,142 * | 12/1987 | Mitchell et al. . |
| 4,997,781 * | 3/1991 | Tigelaar . |
| 5,015,601 * | 5/1991 | Yoshikawa . |
| 6,103,577 * | 8/2000 | Horng ................................... 438/262 |
| B1 6,172,396 * | 1/2001 | Chang .................................. 257/316 |

* cited by examiner

*Primary Examiner*—Richard Booth
(74) *Attorney, Agent, or Firm*—Brinks Hofer Gilson & Lione

(57) ABSTRACT

A process for fabricating a MONOS device having a buried bit-line includes providing a semiconductor substrate and forming an ONO structure overlying the semiconductor substrate. Thereafter, a hard mask layer is formed to overlie ONO structure, the hard mask layer having an upper surface. To form a trench for the buried bit-line, an etch process is performed on the ONO structure. Thereafter, silicon dioxide is deposited to fill the trench. To control a thickness of the deposited silicon dioxide, a chemical-mechanical-polishing process is performed to planarize the silicon dioxide and form a planar surface continuous with the upper surface of the hard mask layer. Finally, the hard mask layer is removed and the remaining silicon dioxide forms a uniform bit-line oxide layer.

18 Claims, 2 Drawing Sheets

PROCESS FOR FABRICATING A BIT-LINE USING BURIED DIFFUSION ISOLATION

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,427 "METHOD OF FABRICATING A MONOS FLASH CELL USING SHALLOW TRENCH ISOLATION".

U.S. patent application Ser. No. 09/426,205 "PROCESS FOR FABRICATING A BIT-LINE IN A MONOS DEVICE USING A DUAL LAYER HARD MASK".

U.S. patent application Ser. No. 09/426,672 "INTEGRATED METHOD BY USING HIGH TEMPERATURE OXIDE FOR TOP OXIDE AND PERIPHERY GATE OXIDE".

U.S. patent application Ser. No. 09/426,743 "PROCESS FOR FORMING A BIT-LINE IN A MONOS DEVICE".

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) cell. A problem exists with known MONOS fabrication techniques in that a thickness of a bit-line oxide layer is difficult to control which causes unpredictable MONOS performance. If the thickness of the bit-line oxide layer is not accurately formed, charge cannot be adequately stored within the ONO structure.

A problem occurs in that even a 5 to 10 angstrom variation in the thickness of the ONO structure's lower oxide layer can adversely affect the total amount of implanted arsenic. Thereafter, during the bit-line oxidation process, the amount of implanted arsenic affects the rate of oxidation of the bit-line oxide layer. In particular, a heavily doped arsenic implant enhances the oxidation rate. The variation of the arsenic concentration causes a twenty percent variation, or more, in the thickness of the bit-line oxidation layer. The variation in the bit-line oxidation layer produces unpredictable MONOS cell performance.

Therefore, while recent advances in MONOS cell technology have enabled memory designers to improve MONOS cells, numerous challenges exist in the fabrication of material layers within these devices. In particular, a fabrication process of MONOS cells should accommodate precise control of the thickness of a bit-line oxide layer. Accordingly, advances in MONOS cell fabrication technology are necessary to control bit-line oxide layer fabrication and insure high quality MONOS cell devices.

BRIEF SUMMARY OF THE INVENTION

Such needs are met or exceeded by the present method for fabricating a MONOS cell. According to an aspect of the present invention a uniform bitline oxide layer is formed to ensure a desired thickness of the bit-line oxide layer. Therefore, a quality of the MONOS cell is improved.

More specifically, in one form, a process for fabricating a buried bit-line structure for a MONOS cell includes providing a semiconductor substrate and forming an ONO structure overlying the semiconductor substrate. Thereafter, a hard mask layer is formed to overlie ONO structure, the hard mask layer having an upper surface. To form a trench for the buried bit-line, an etch process is performed on the ONO structure. Thereafter, silicon dioxide is deposited to fill the trench. To control a thickness of the deposited silicon dioxide, a chemical-mechanical-polishing process is performed to planarize the silicon dioxide and form a planar surface continuous with the upper surface of the hard mask layer. Finally, the hard mask layer is removed and the remaining silicon dioxide forms a uniform bit-line oxide layer.

BRIEF DESCRIPTION OF THE DRAWINGS

Other features and advantages of the invention will be apparent to those skilled in the art with reference to the detailed description and the drawings, of which.

Figure 1:
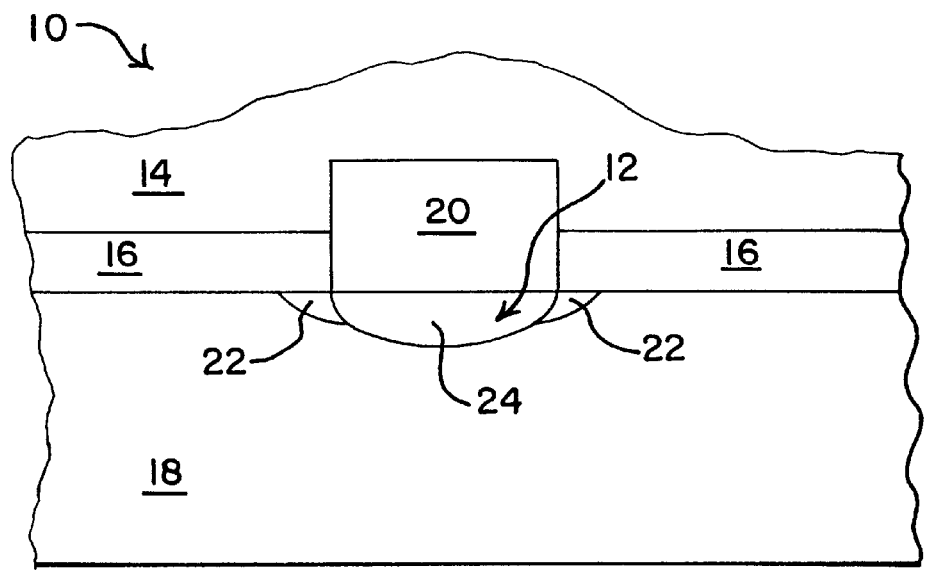
FIG. 1 illustrates, in cross-section, a portion of a semiconductor substrate containing a transistor that incorporates a bit-line oxide layer fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PREFERRED EMBODIMENTS

Referring to FIG. 1, a memory portion of a MONOS cell 10 is shown in cross-section, which can be used in EEPROM and flash type devices. MONOS cell 10 includes at least one buried bit-line 12, a word-line 14 and an ONO structure 16 which function together to determine the location of a charge stored in memory. The buried bit-line 12 and the ONO structure 16 overlie a semiconductor substrate 18. Overlying the buried bit-line 12 is a bit-line oxide layer 20, and also included are boron regions 22 and an arsenic region 24.

Those skilled in the art will recognize that the proper functioning of a MONOS cell device necessarily requires that an electrical charge is accurately introduced into a silicon nitride layer of the ONO structure 16. In particular, a uniform bit-line oxidation process is necessary to accurately form the bit-line oxide layer 20. In accordance with the invention, a thickness of the bit-line oxide layer 20 is accurately formed. Control of the bit-line oxide layer thickness which is obtained by the present invention can be better understood with the following description of a MONOS fabrication process carried out in accordance with the invention.

Figure 2:
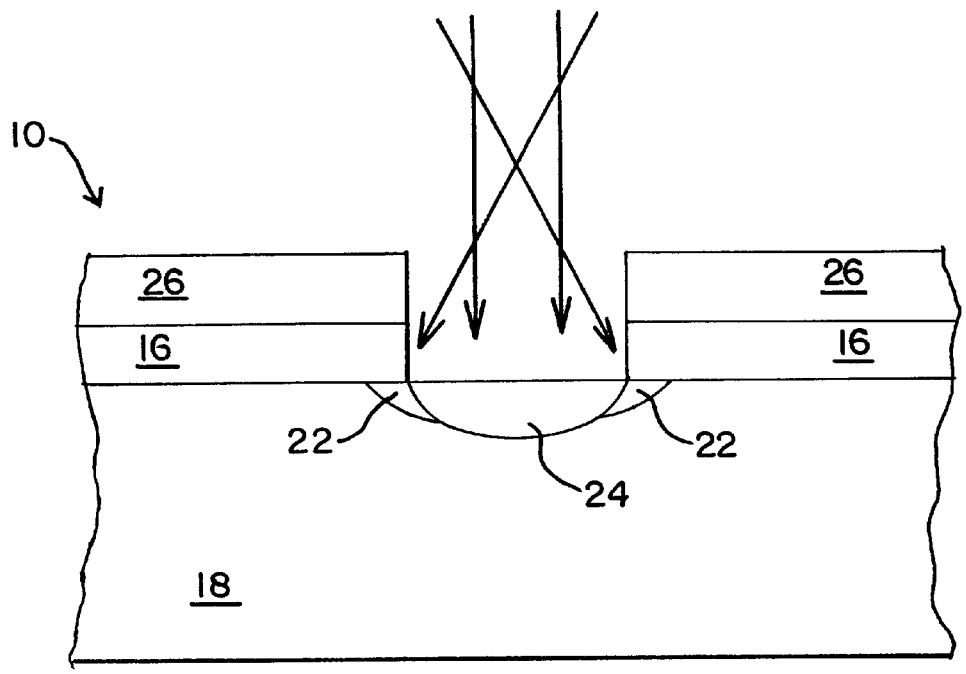
FIGS. 2–5 illustrate, in cross-section, process steps for the fabrication of a buried bit-line structure in accordance with the invention.

Referring now to FIG. 2, those skilled in the art will appreciate that an ONO structure 16 is formed to overlie the semiconductor substrate 18. Thereafter, according to the preferred embodiment of the present invention, to form a hard mask preferably a silicon nitride layer 26 is formed to overlie the ONO structure 16. Those skilled in the art will appreciate that other materials may be used to form the hard mask so long as the material can be selectively etched to stop on the ONO structure 16, such as oxy-nitride and polycrystalline silicon.

The silicon nitride layer 26 is utilized as a mask and as a chemical-mechanical-polishing (CMP) process stopping layer during a CMP fabrication step described below. Preferably, the silicon nitride layer 26 should be thick enough to avoid boron and arsenic from penetrating the semiconductor substrate 18 during a boron and arsenic implant described below. Therefore, silicon nitride is deposited, for example, using a low-pressure-chemical-vapor-deposition (LPCVD) process which is carried out for a period of time and at gas flow rates sufficient to form a silicon nitride layer 38 which preferably has a thickness of about 2000 angstroms. Those skilled in the art will appreciate that other chemical-vapor-deposition (CVD) processes can be utilized such as plasma-enhanced-chemical-vapor-deposition (PECVD) process.

After forming the silicon nitride layer 26, the ONO structure 16 is etched and boron and arsenic are implanted into the semiconductor substrate 18 to form boron regions 22 and arsenic region 24 respectively. The boron is implanted at a high angle, typically about twenty-five degrees to form boron regions 22. In addition, arsenic is implanted at a low angle, typically about zero to about seven degrees, to form arsenic region 24.

Figure 3:
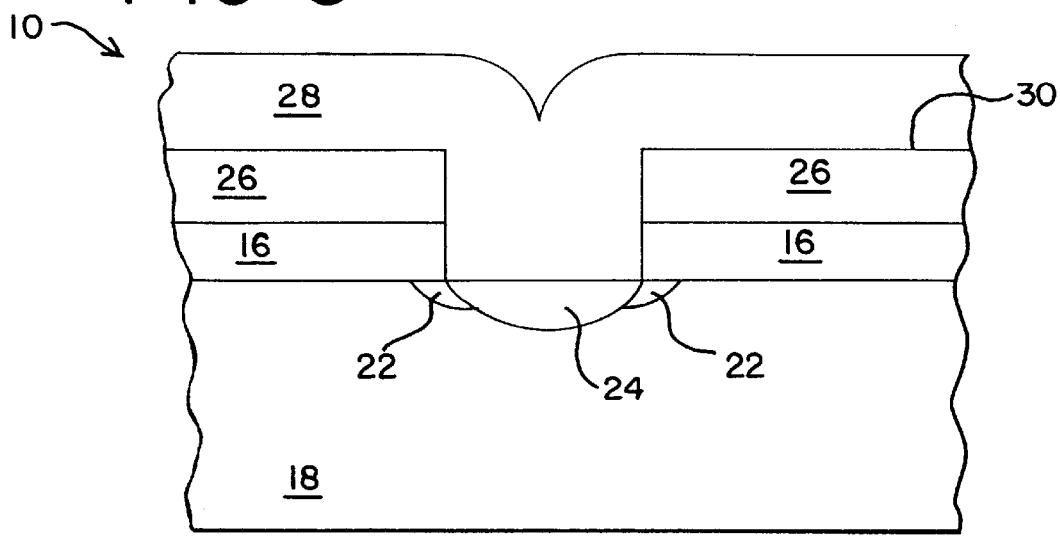

Referring to FIG. 3, after the boron and the arsenic are implanted, silicon dioxide preferably is deposited to form silicon oxide layer 28 to overfill the trench formed by the silicon nitride layer 26 mask. For example, the trench is filled using the PECVD process carried out at a temperature of about 400° C. The process typically is carried out with a mixture of ozone and tetraethyl-ortho-silane (TEOS) gas, for a period of time sufficient to overfill the trench with silicon oxide layer 28. Those skilled in the art will appreciate that silicon oxide layer 28 can be deposited by other processes, such as a lowpressure-chemical-vapor-deposition (LPCVD) process, a selective deposition process, a molecular beam deposition process, a high-density-plasma (HDP) deposition process, and the like.

A thermal anneal process is performed to densify, and therefore to stabilize, the silicon oxide layer 28. The thermal anneal process also acts to activate the implanted boron and arsenic. Preferably, the annealing process is performed at about 900° C.

Figure 4:
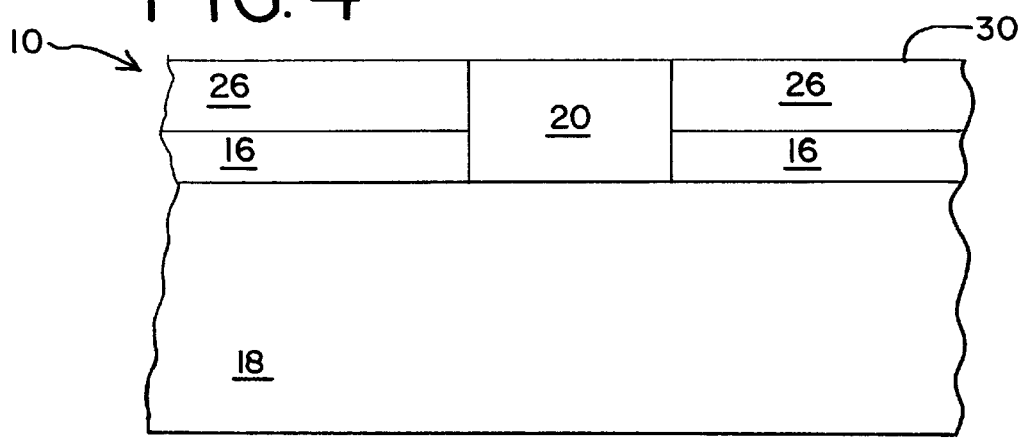

Referring to FIG. 4, after the silicon oxide layer 28 is formed, to form the bit-line oxide layer 20, a planarization process is carried out to remove portions of silicon oxide layer 28 overlying upper surface 30 of semiconductor substrate 18. Preferably a chemical-mechanical-process (CMP) is used to planarize silicon oxide layer 28 and to form a continuous surface with upper surface 30 of semiconductor substrate 18. Alternatively, a planarization etch process can be used to remove portions of silicon oxide layer 28. Thus, according to the preferred embodiment of the present invention, by forming the bit-line oxidation layer 20, and utilizing a planarization process, a bit-line layer 20 is formed having a thickness substantially similar to the depth of the trench.

Figure 5:
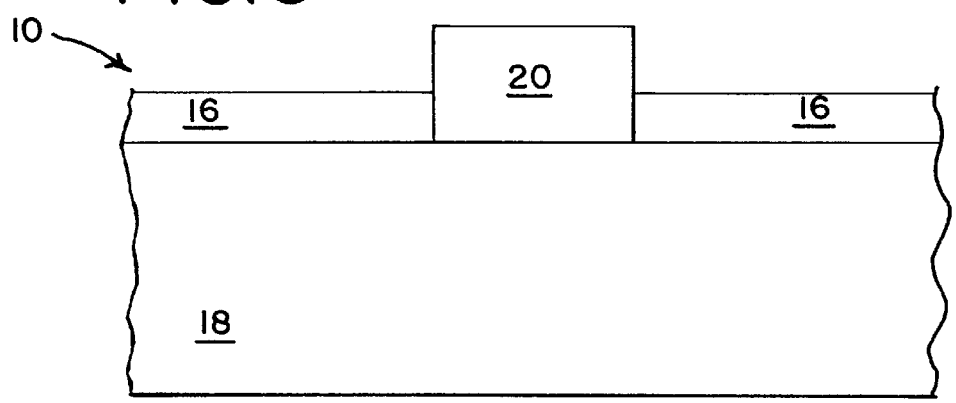

Referring to FIG. 5, thereafter, the silicon nitride layer 26 is removed, for example, with phosphoric acid solution performed at about 125° C. Those skilled in the art will appreciate that other etching processes can be used as long as they so not compromise the top oxide layer of the ONO structure 26.

Referring again to FIG. 1, the MONOS cell device is further completed by depositing a layer of polycrystalline silicon layer 14 to overlie the top oxide layer of ONO structure 16, and the bit-line oxide layer 20. The polycrystalline silicon layer 14 is deposited, for example, with an LPCVD process. Thereafter, those skilled in the art will appreciate that the MONOS cell processing continues in a manner known in the art.

From the foregoing description, it should be understood that an improved method of generating a MONOS cell has been shown and described which has many desirable attributes and advantages. According to the above described embodiments, a thickness of the bit-line oxide layer is ensured. Therefore, a quality of the MONOS cell is improved.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating a buried bit-line for a MONOS device, the process comprising the steps of:

providing a semiconductor substrate;

forming an ONO structure overlying said semiconductor substrate;

forming a hard mask layer overlying said ONO structure, said hard mask layer having an upper surface;

performing an etch process to form a trench in said ONO structure;

forming silicon dioxide to fill said trench;

performing a chemical-mechanical-polishing process to planarize said silicon dioxide and to form a planar surface continuous with said upper surface of said hard mask layer; and removing said hard mask layer, wherein said remaining silicon dioxide functions as a bit-line oxide layer.

2. The process of claim 1 further comprising the steps of:
depositing a polycrystalline silicon layer to overlie said ONO structure.

3. The process of claim 1 further comprising the step of implanting boron and arsenic into the semiconductor substrate after the step of performing said etch.

4. The process of claim 1 wherein said hard mask layer comprises a silicon nitride layer.

5. The process of claim 4, wherein the step of forming said silicon nitride layer comprises low-pressure-chemical-vapor-deposition to form said silicon nitride layer having a thickness of about 2000 angstroms.

6. The process of claim 4, wherein the step of forming said silicon nitride layer comprises plasma-enhanced-chemical-vapor-deposition to form said silicon nitride layer having a thickness of about 2000 angstroms.

7. The process of claim 1 wherein said hard mask layer comprises a polycrystalline silicon layer.

8. The process of claim 1 wherein the step of depositing silicon dioxide to fill said trench comprises using a plasma-enhanced-chemical-vapor-deposition process carried out for a time sufficient to fill said trench.

9. The process of claim 1 wherein the step of depositing silicon dioxide to fill said trench comprises using a low-pressure-chemical-vapor-deposition process.

10. The process of claim 1 wherein the step of depositing silicon dioxide to fill said trench comprises utilizing a high-density-plasma process.

11. The process of claim 1 further comprising the step of performing a thermal anneal after said step of depositing said silicon dioxide, wherein said step of thermal anneal comprises annealing at about 900° C.

12. A process for fabricating a MONOS device including a buried bit-line, the process comprising the steps of:

providing a semiconductor substrate having at least one bit-line oxide layer;

forming the buried bit-line by first, forming an ONO structure overlying said semiconductor substrate, second, forming a hard mask layer overlying said ONO structure, said hard mask layer having an upper surface, third, performing an etch process to form a trench in said ONO structure, fourth, forming silicon dioxide to fill said trench, fifth, performing a chemical-mechanical-polishing process to planarize said silicon dioxide and forming a planar surface continuous with said upper surface of said hard mask layer, and sixth, removing said hard mask layer, wherein said remaining silicon dioxide functions as a bit-line oxide layer; and depositing a polycrystalline silicon layer to overlie said oxide-nitride-oxide layer.

13. The process of claim 12 further comprising the step of implanting boron and arsenic into the semiconductor substrate after the step of performing said etch.

14. The process of claim 12, wherein the step of forming said silicon nitride layer comprises rapid-thermal-chemical-vapor-deposition to form a said silicon nitride layer having a thickness of about 2000 angstroms.

15. The process of claim 12 wherein the step of depositing silicon dioxide to fill said trench comprises using a plasma-enhanced-chemical-vapor-deposition.

16. The process of claim 12 wherein the step of depositing silicon dioxide to fill said trench comprises using a low-pressure-chemical-vapor-deposition process.

17. The process of claim 12 wherein the step of depositing silicon dioxide to fill said trench comprises utilizing a high-density-plasma process.

18. The process of claim 12 further comprising the step of performing a thermal anneal after said step of depositing said silicon dioxide, wherein said step of thermal anneal comprises annealing at about 900° C.

* * * * *